United States Patent
Yamada et al.

(10) Patent No.: US 11,081,412 B2
(45) Date of Patent: Aug. 3, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Takenori Yamada, Ibo Hyogo (JP); Tomohiro Iguchi, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/796,557

(22) Filed: Feb. 20, 2020

(65) Prior Publication Data
US 2021/0082781 A1    Mar. 18, 2021

(30) Foreign Application Priority Data
Sep. 18, 2019    (JP) .............................. JP2019-169906

(51) Int. Cl.
*H01L 23/15*     (2006.01)
*H01L 23/14*     (2006.01)
*H01L 23/492*    (2006.01)

(52) U.S. Cl.
CPC ............ *H01L 23/15* (2013.01); *H01L 23/142* (2013.01); *H01L 23/4924* (2013.01)

(58) Field of Classification Search
CPC .... H01L 23/15; H01L 23/142; H01L 23/4924
See application file for complete search history.

(56) References Cited

U.S. PATENT DOCUMENTS

| | | | |
|---|---|---|---|
| 2016/0111345 A1* | 4/2016 | Kawase | ............ H01L 23/49838 307/10.1 |
| 2019/0206751 A1 | 7/2019 | Harada et al. | |
| 2019/0371688 A1 | 12/2019 | Saito et al. | |

FOREIGN PATENT DOCUMENTS

| | | |
|---|---|---|
| JP | H09-107908 A | 1/1997 |
| JP | 2017-224748 A | 12/2017 |
| JP | 2018-163995 A | 10/2018 |
| WO | 2018-154687 A1 | 8/2018 |

* cited by examiner

*Primary Examiner* — Peniel M Gumedzoe
(74) *Attorney, Agent, or Firm* — White & Case LLP (57) ABSTRACT

A semiconductor device of embodiments includes a first semiconductor chip; a metal plate having a first plane and a second plane facing the first plane and including a first ceramic plate provided between the first plane and the second plane; and a first insulating board provided between the first semiconductor chip and the metal plate and facing the first plane, in which the first ceramic plate does not exist between the first semiconductor chip and the second plane.

18 Claims, 11 Drawing Sheets

SEMICONDUCTOR DEVICE

CROSS-REFERENCE TO RELATED APPLICATION

This application is based upon and claims the benefit of priority from Japanese Patent Application No. 2019-169906, filed on Sep. 18, 2019, the entire contents of which are incorporated herein by reference.

FIELD

Embodiments described herein relate generally to a semiconductor device.

BACKGROUND

In a power semiconductor module, a power semiconductor chip is mounted, for example, on a metal base plate with an insulating board interposed. The power semiconductor chip is, for example, an insulated gate bipolar transistor (IGBT), a metal oxide field effect transistor (MOSFET), or a diode.

In the power semiconductor chip, since a high current flows at a high voltage, an amount of heat generation becomes large. If the heat dissipation property of the power semiconductor module is low, due to the heat generation of the power semiconductor chip, for example, reliability failure occurs in the power semiconductor module. The reliability failure is, for example, open failure of a bonding wire. For this reason, in the power semiconductor module, it is required to improve a heat dissipation property.

DETAILED DESCRIPTION

A semiconductor device of an embodiment includes: a first semiconductor chip; a metal plate having a first plane and a second plane facing the first plane and including a first ceramic plate provided between the first plane and the second plane; and a first insulating board provided between the first semiconductor chip and the metal plate and facing the first plane, in which the first ceramic plate does not exist between the first semiconductor chip and the second plane.

In this specification, in some cases, the same or similar members are denoted by the same reference numerals, and redundant description is omitted.

In this specification, in some cases, in order to illustrate positional relationship of components and the like, the upward direction of the drawing is denoted by "upper", and the downward direction of the drawing is denoted by "lower". In this specification, the concept of the "upper" and the "lower" is not necessarily terms indicating the relationship based on the direction of gravity.

First Embodiment

A semiconductor device of a first embodiment includes: a first semiconductor chip; a metal plate having a first plane and a second plane facing the first plane and including a first ceramic plate provided between the first plane and the second plane; and a first insulating board provided between the first semiconductor chip and the metal plate and facing the first plane, in which the first ceramic plate does not exist between the first semiconductor chip and the second plane.

Figure 1A:
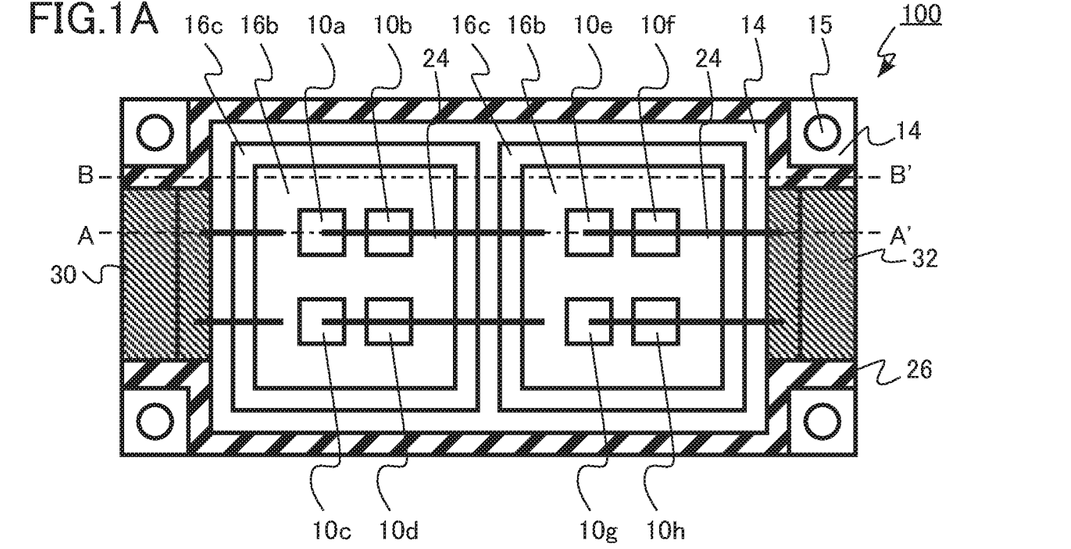
FIGS. 1A, 1B, and 1C are schematic views of a semiconductor device of a first embodiment.
Figure 1B:
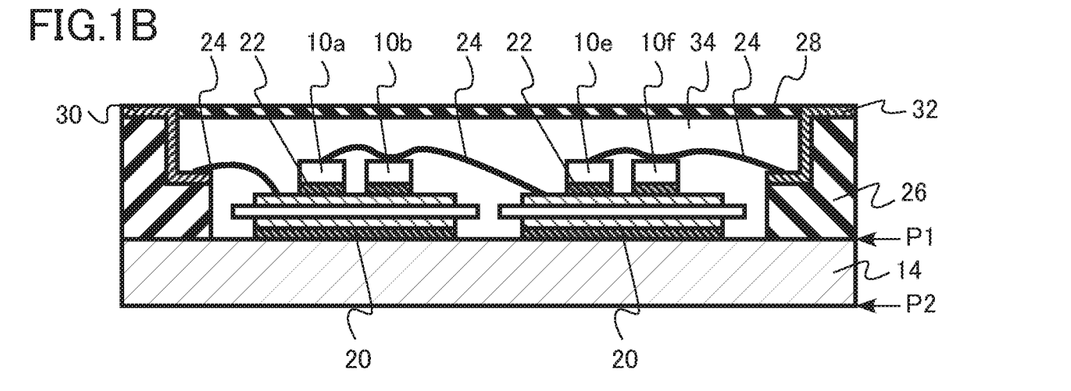
Figure 1C:
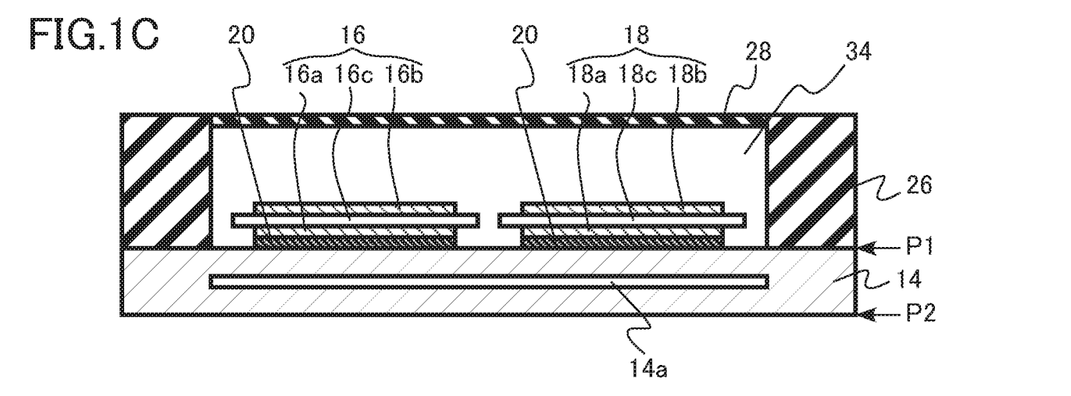

FIGS. 1A, 1B, and 1C are schematic views of the semiconductor device of the first embodiment. FIG. 1A is a top view of the semiconductor device of the first embodiment. FIG. 1B is a cross-sectional view of the semiconductor device of the first embodiment. FIG. 1B is a cross-sectional view taken along line A-A' of FIG. 1A. FIG. 1C is a cross-sectional view of the semiconductor device of the first embodiment. FIG. 1C is a cross-sectional view taken along line B-B' of FIG. 1A. In addition, in FIG. 1A, a lid is omitted in illustration.

The semiconductor device of the first embodiment is a power semiconductor module 100 including MOSFETs. The MOSFET is an example of a semiconductor chip.

A power semiconductor module 100 of the first embodiment includes a first MOSFET 10a (first semiconductor chip), a second MOSFET 10b (second semiconductor chip), a third MOSFET 10c, a fourth MOSFET 10d, a fifth MOSFET 10e (third semiconductor chip), a sixth MOSFET 10f, a seventh MOSFET 10g, an eighth MOSFET 10h, a metal base plate 14 (metal plate), a first insulating circuit board 16 (first insulating board), a second insulating circuit board 18 (second insulating board), a first bonding layer 20, a second bonding layer 22, bonding wires 24, a resin case 26, a lid 28, a first power terminal 30, a second power terminal 32 and silicone gel 34.

The metal base plate 14 includes a first ceramic plate 14a. The metal base plate 14 has screw holes 15. The metal base plate 14 has a first plane P1 and a second plane P2.

The first insulating circuit board 16 includes a first lower metal layer 16a, a first upper metal layer 16b, and a first ceramic layer 16c (ceramic layer). The second insulating circuit board 18 includes a second lower metal layer 18a, a second upper metal layer 18b, and a second ceramic layer 18c.

The first MOSFET 10a (first semiconductor chip), the second MOSFET 10b (second semiconductor chip), the third MOSFET 10c, and the fourth MOSFET 10d are provided on the first insulating circuit board 16.

The fifth MOSFET 10e (third semiconductor chip), the sixth MOSFET 10f, the seventh MOSFET 10g, and the eighth MOSFET 10h are provided on the second insulating circuit board 18.

The first to eighth MOSFETs 10a to 10h are power MOSFETs having a high breakdown voltage. The first to eighth MOSFETs 10*a* to 10*h* are vertical type MOSFETs using, for example, silicon or silicon carbide.

The first to fourth MOSFETs 10*a* to 10*d* are fixed to the first insulating circuit board 16 by the second bonding layer 22. The fifth to eighth MOSFETs 10*e* to 10*h* are fixed to the second insulating circuit board 18 by the second bonding layer 22.

The second bonding layer 22 is made of, for example, a solder. The second bonding layer 22 is made of, for example, a silver paste.

The metal base plate 14 has a first plane P1 and a second plane P2. The second plane P2 faces the first plane P1. The first plane P1 is an upper plane of the metal base plate 14, and the second plane P2 is a lower plane of the metal base plate 14.

The metal base plate 14 is made of a metal. The metal base plate 14 is made of, for example, aluminum. The metal base plate 14 may be made of, for example, pure copper or a copper alloy.

The metal base plate 14 has a function of increasing the mechanical strength of the power semiconductor module 100. In addition, the metal base plate 14 has a function of conducting the heat generated during the operation of the first to eighth MOSFETs 10*a* to 10*h* to the outside of the power semiconductor module 100.

For example, when mounting the power semiconductor module 100 to a product, the lower plane of the metal base plate 14 is connected to a heat dissipation member such as a heat dissipation fin (not illustrated). For example, the four corners and the heat dissipation member of the power semiconductor module 100 are fixed with screws by using the screw holes 15, so that the metal base plate 14 and the heat dissipation member are fixed.

The first insulating circuit board 16 is provided between the first to fourth MOSFETs 10*a* to 10*d* and the metal base plate 14. The first insulating circuit board 16 faces the first plane P1 of the metal base plate 14.

The first insulating circuit board 16 has a function of ensuring electrical insulation between the first to fourth MOSFETs 10*a* to 10*d* and the metal base plate 14.

The first insulating circuit board 16 includes a first lower metal layer 16*a*, a first upper metal layer 16*b*, and a first ceramic layer 16*c* (ceramic layer). The first ceramic layer 16*c* is interposed between the first lower metal layer 16*a* and the first upper metal layer 16*b*.

The first lower metal layer 16*a* and the first upper metal layer 16*b* contain, for example, copper. The first lower metal layer 16*a* and the first upper metal layer 16*b* are made of, for example, pure copper.

The first ceramic layer 16*c* is made of a ceramic. The first ceramic layer 16*c* is made of, for example, aluminum nitride, silicon nitride, or aluminum oxide.

The second insulating circuit board 18 is provided between the fifth to eighth MOSFETs 10*e* to 10*h* and the metal base plate 14. The second insulating circuit board 18 faces the first plane P1 of the metal base plate 14.

The second insulating circuit board 18 has a function of ensuring electrical insulation between the fifth to eighth MOSFETs 10*e* to 10*h* and the metal base plate 14.

The second insulating circuit board 18 includes a second lower metal layer 18*a*, a second upper metal layer 18*b*, and a second ceramic layer 18*c* (ceramic layer). The second ceramic layer 18*c* is interposed between the second lower metal layer 18*a* and the second upper metal layer 18*b*.

The second lower metal layer 18*a* and the second upper metal layer 18*b* contain, for example, copper. The second lower metal layer 18*a* and the second upper metal layer 18*b* are made of, for example, pure copper.

The second ceramic layer 18*c* is made of a ceramic. The second ceramic layer 18*c* is made of, for example, aluminum nitride, silicon nitride, or aluminum oxide.

The first insulating circuit board 16 and the second insulating circuit board 18 are fixed to the metal base plate 14 by using the first bonding layer 20. The first bonding layer 20 is made of, for example, a solder. The first bonding layer 20 is made of, for example, a silver paste.

The resin case 26 is provided to surround the periphery of the first insulating circuit board 16 and the second insulating circuit board 18. The resin lid 28 is provided on the resin case 26. The first insulating circuit board 16 and the second insulating circuit board 18 are interposed between the lid 28 and the metal base plate 14.

In addition, the interior of the power semiconductor module 100 is filled with the silicone gel 34 as a sealing material. The resin case 26, the metal base plate 14, the lid 28, and the silicone gel 34 have a function of protecting or insulating the members inside the power semiconductor module 100.

The first power terminal 30 and the second power terminal 32 are provided on the top of the resin case 26. For example, an AC output terminal (not illustrated) and a gate terminal are provided on the top of the resin case 26. The power semiconductor module 100 is electrically connected to the outside by the first power terminal 30 and the second power terminal 32.

The bonding wires 24 are electrically connected, for example, to the first power terminal 30, the first to eighth MOSFETs 10*a* to 10*h*, and the second power terminal 32. The bonding wires 24 are for example, aluminum wires.

Figure 2A:
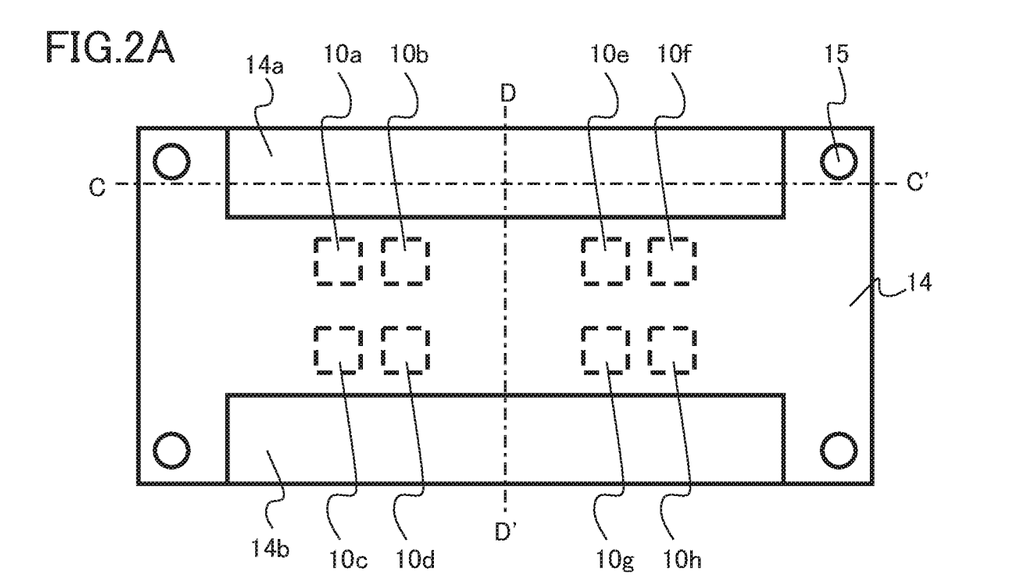
FIGS. 2A, 2B, and 2C are schematic views of a metal plate of the first embodiment.
Figure 2B:
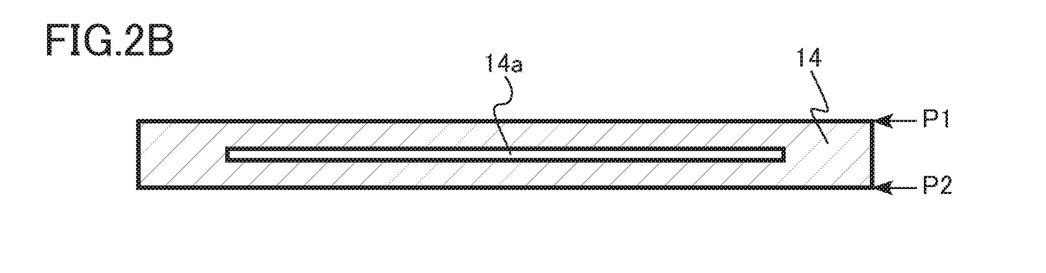
Figure 2C:
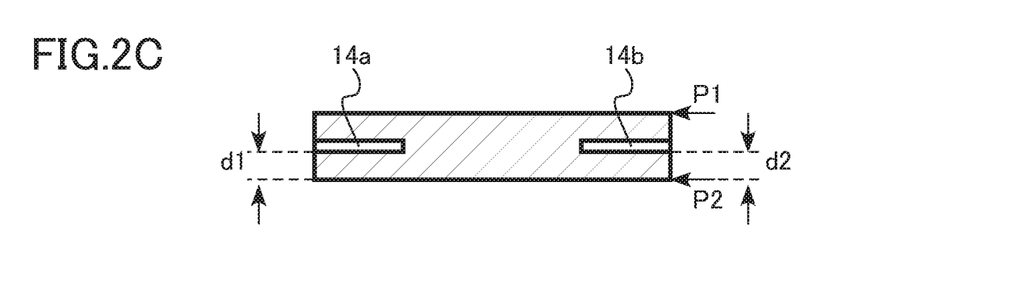

FIGS. 2A, 2B, and 2C are schematic views of a metal plate of the first embodiment. FIG. 2A is a top view of the metal plate. FIG. 2B is a cross-sectional view of the metal plate. FIG. 2B is a cross-sectional view taken along line C-C' of FIG. 2A. FIG. 2C is a cross-sectional view of the metal plate. FIG. 2C is a cross-sectional view taken along line D-D' of FIG. 2A.

The metal base plate 14 includes a first ceramic plate 14*a* and a second ceramic plate 14*b*. The first ceramic plate 14*a* and the second ceramic plate 14*b* are provided between the first plane P1 and the second plane P2. The first ceramic plate 14*a* and the second ceramic plate 14*b* are separated from the first plane P1 and the second plane P2.

At least portions of the first ceramic plate 14*a* and the second ceramic plate 14*b* are buried in the metal base plate 14. For example, at least other portions of the first ceramic plate 14*a* and the second ceramic plate 14*b* are exposed from the side surface of the metal base plate 14. The first ceramic plate 14*a* and the second ceramic plate 14*b* are buried in the metal base plate 14 by using, for example, a metal melting method in the formation of the metal base plate 14.

In FIG. 2A, the outlines of the first ceramic plate 14*a* and the second ceramic plate 14*b* located inside the metal base plate 14 are illustrated by using solid lines. In FIG. 2A, as the patterns of the first to eighth MOSFETs 10*a* to 10*h*, the patterns that projected onto the metal base plate 14 toward the direction normal to the first plane P1 are illustrated by using dotted lines.

The first ceramic plate 14*a* and the second ceramic plate 14*b* are separated from each other.

The first ceramic plate 14*a* does not exist between the first MOSFET 10*a* and the second plane P2. The first ceramic plate 14*a* does not exist between the second MOSFET 10*b* and the second plane P2. Similarly, the first ceramic plate 14a does not exist between the third to eighth MOSFETs 10c to 10h and the second plane P2. The first ceramic plate 14a is not located in the direction normal to the first plane P1 of any one of the first to eighth MOSFETs 10a to 10h.

The second ceramic plate 14b does not exist between the first MOSFET 10a and the second plane P2. The second ceramic plate 14b does not exist between the second MOSFET 10b and the second plane P2. Similarly, the second ceramic plate 14b does not exist between the third to eighth MOSFETs 10c to 10h and the second plane P2. The second ceramic plate 14b is not located in the direction normal to the first plane P1 of any one of the first to eighth MOSFETs 10a to 10h.

The first ceramic plate 14a and the second ceramic plate 14b do not exist inside the metal base plate 14 between the first to eighth MOSFETs 10a to 10h and the second plane P2. The first ceramic plate 14a and the second ceramic plate 14b do not exist in the region directly below the first to eighth MOSFETs 10a to 10h.

A first distance (d1 in FIG. 2C) between the second plane P2 and the first ceramic plate 14a and a second distance (d2 in FIG. 2C) between the second plane P2 and the second ceramic plate 14b are substantially equal to each other. The first ceramic plate 14a and the second ceramic plate 14b are located in the same plane parallel to the first plane P1 and the second plane P2 inside the metal base plate 14.

The first ceramic plate 14a and the second ceramic plate 14b are made of a ceramic. The first ceramic plate 14a and the second ceramic plate 14b are made of, for example, aluminum nitride, silicon nitride, or aluminum oxide. The first ceramic plate 14a and the second ceramic plate 14b are made of, for example, the same material as the first ceramic layer 16c and the second ceramic layer 18c.

Next, functions and effects of the semiconductor device of the first embodiment will be described.

Figure 3A:
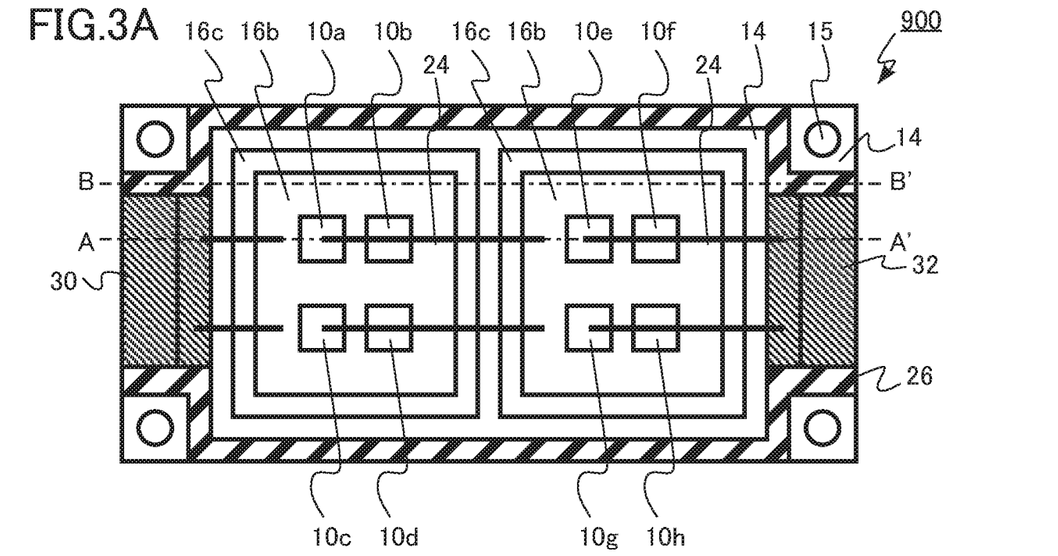
FIGS. 3A, 3B, and 3C are schematic views of a semiconductor device of Comparative Example.
Figure 3B:
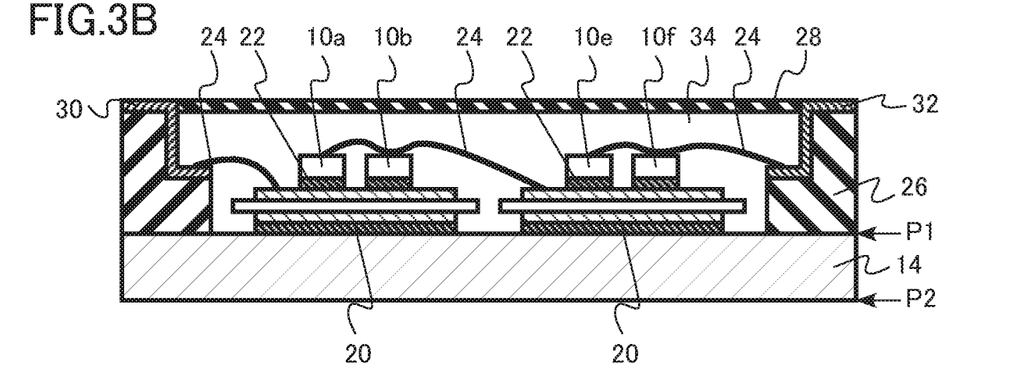
Figure 3C:
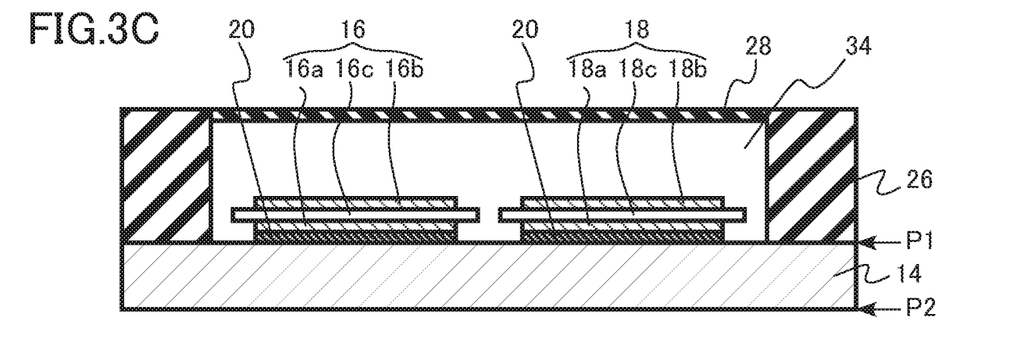

FIGS. 3A, 3B, and 3C are schematic views of a semiconductor device of Comparative Example. FIG. 3A is a top view of the semiconductor device of Comparative Example. FIG. 3B is a cross-sectional view of the semiconductor device of Comparative Example. FIG. 3B is a cross-sectional view taken along line A-A' of FIG. 3A. FIG. 3C is a cross-sectional view of the semiconductor device of Comparative Example. FIG. 3C is a cross-sectional view taken along line B-B' of FIG. 3A. In addition, in FIG. 3A, a lid is omitted in illustration.

The semiconductor device of Comparative Example is a power semiconductor module 900 including MOSFETs. The power semiconductor module 900 of Comparative Example is different from the power semiconductor module 100 of the first embodiment in that the metal base plate 14 does not have the first ceramic plate 14a and the second ceramic plate 14b.

Figure 4A:
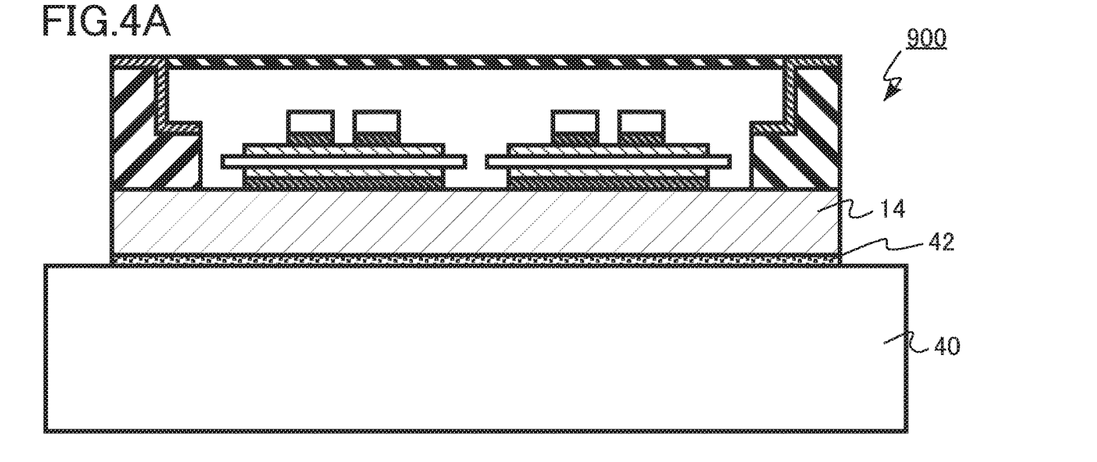
FIGS. 4A, 4B, and 4C are explanatory views of problems of the semiconductor device of Comparative Example.
Figure 4B:
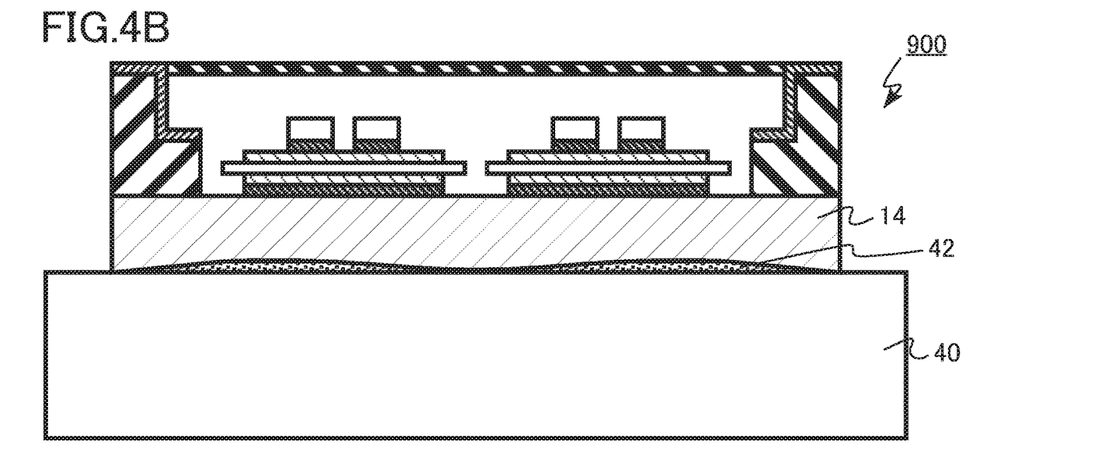
Figure 4C:
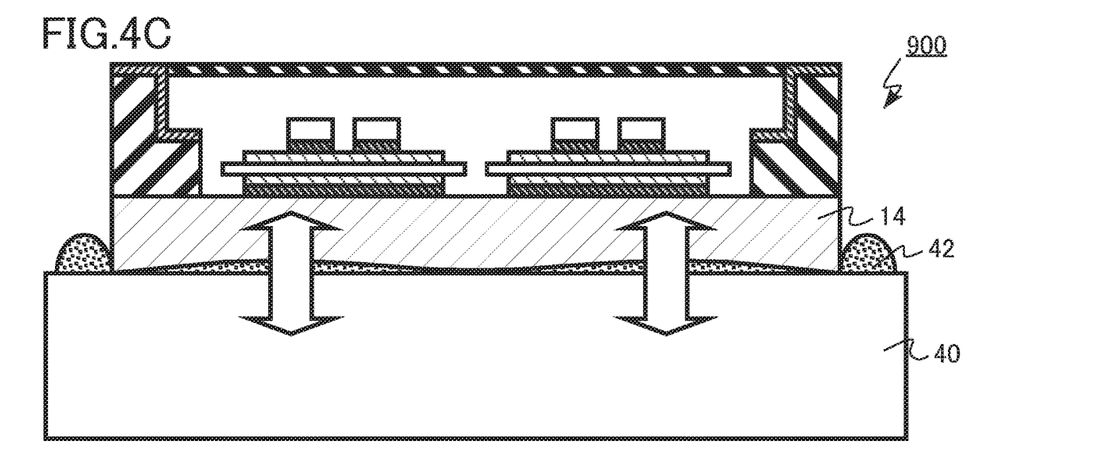

FIGS. 4A, 4B, and 4C are explanatory views of problems of the semiconductor device of Comparative Example. FIGS. 4A, 4B, and 4C illustrate the power semiconductor module 900, the heat dissipation member, and heat dissipation grease.

When mounting the power semiconductor module 900 to the product, the heat dissipation member 40 such as a heat dissipation fin is connected to the back surface of the metal base plate 14. For example, by fixing the four sides and the heat dissipation member 40 of the power semiconductor module 900 with screws and pressing the metal base plate 14, the metal base plate 14 and the heat dissipation member 40 are fixed in close contact with each other.

In order to reduce thermal resistance of the contact surface, heat dissipation grease 42 is interposed between the metal base plate 14 and the heat dissipation member 40. Since the heat dissipation grease 42 has a high thermal conductivity, the thermal resistance of the contact surface is reduced, and thus, heat is efficiently transferred from the metal base plate 14 to the heat dissipation member 40.

FIG. 4A illustrates a state in which the metal base plate 14 and the heat dissipation member 40 are ideally fixed. The lower plane (second plane P2) of the metal base plate 14 is flat, and the thickness of the heat dissipation grease 42 between the lower plane of the metal base plate 14 and the heat dissipation member 40 becomes even.

FIG. 4B illustrates a state that may actually occur in the power semiconductor module 900 of Comparative Example. When manufacturing the power semiconductor module 900, the first insulating circuit board 16 and the second insulating circuit board 18 are fixed to the metal base plate 14 by using, for example, solder bonding.

For example, the first insulating circuit board 16 and the metal base plate 14 are different from each other in terms of a linear expansion coefficient. For this reason, due to the heat treatment applied at the time of solder-bonding the first insulating circuit board 16 to the metal base plate 14, unevenness occurs on the lower plane of the metal base plate 14 as illustrated in FIG. 4B. Therefore, the thickness of the heat dissipation grease 42 between the lower plane of the metal base plate 14 and the heat dissipation member 40 becomes uneven.

FIG. 4C illustrates a state when the power semiconductor module 900 of Comparative Example is allowed to continuously operate. If the power semiconductor module 900 is allowed to continuously operate, due to the heat generation of the MOSFETs, the metal base plate 14 repeats expansion and contraction. For this reason, the size of the gap between the lower plane of the metal base plate 14 and the heat dissipation member 40 is changed. As a result, there occurs a phenomenon, so-called pump-out phenomenon that the heat dissipation grease 42 protrudes out from the region between the lower plane of the metal base plate 14 and the heat dissipation member 40.

When the pump-out phenomenon occurs, the amount of heat dissipation grease 42 between the lower plane of the metal base plate 14 and the heat dissipation member 40 is decreased. Therefore, the region where the heat dissipation grease 42 is insufficient occurs, and thus, the heat resistance of the contact surface is increased, so that the heat dissipation property of the power semiconductor module 900 is lowered. For this reason, reliability failure occurs in, for example, the power semiconductor module 900.

In order to improve the heat dissipation property of the power semiconductor module 900, it is desired to suppress the unevenness of the lower plane of the metal base plate 14 occurring during the manufacturing and to suppress the expansion and contraction of the metal base plate 14 during the operation.

In the power semiconductor module 100 of the first embodiment, the metal base plate 14 includes a first ceramic plate 14a and a second ceramic plate 14b having a small linear expansion coefficient inside the metal base plate 14. Therefore, the difference in linear expansion coefficient, for example, between the first insulating circuit board 16 and the metal base plate 14 is decreased. Therefore, even though the heat treatment is applied when solder-bonding the first insulating circuit board 16, the occurrence of the unevenness in the lower plane of the metal base plate 14 is suppressed. In addition, the effective linear expansion coefficient of the metal base plate 14 is decreased. For this reason, the expansion and contraction of the metal base plate 14 during the operation of the power semiconductor module 100 are suppressed. Thus, the pump-out phenomenon is less likely to occur.

In addition, in the power semiconductor module 100, the first ceramic plate 14a and the second ceramic plate 14b do not exist in the region directly below the first to eighth MOSFETs 10a to 10h. Therefore, the first ceramic plate 14a and the second ceramic plate 14b do not exist on the path where heat generated in the first to eighth MOSFETs 10a to 10h is transferred to the heat dissipation member 40. Therefore, the deterioration of the heat dissipation property due to the first ceramic plate 14a and the second ceramic plate 14b is suppressed.

The shapes, sizes, thicknesses, disposition positions, and the like of the first ceramic plate 14a and the second ceramic plate 14b are optimized according to the position, the number of semiconductor chips to be mounted on the power semiconductor module 100, and the like.

From the viewpoint of decreasing the difference in linear expansion coefficient between the first insulating circuit board 16 and the metal base plate 14, it is preferable that the first ceramic plate 14a and the second ceramic plate 14b are made of the same material as the first ceramic layer 16c and the second ceramic layer 18c. It is preferable that the first ceramic plate 14a, the second ceramic plate 14b, the first ceramic layer 16c, and the second ceramic layer 18c are made of, for example, aluminum nitride.

From the viewpoint of facilitating manufacturing of the metal base plate 14, it is preferable that the metal base plate 14 is made of aluminum.

As described above, according to the first embodiment, it is possible to implement a semiconductor device which can improve a heat dissipation property.

Second Embodiment

A semiconductor device of a second embodiment is different from the semiconductor device of the first embodiment in that the metal plate does not have the second ceramic plate. Hereinafter, a portion of the contents overlapped with the first embodiment will be omitted in description.

Figure 5A:
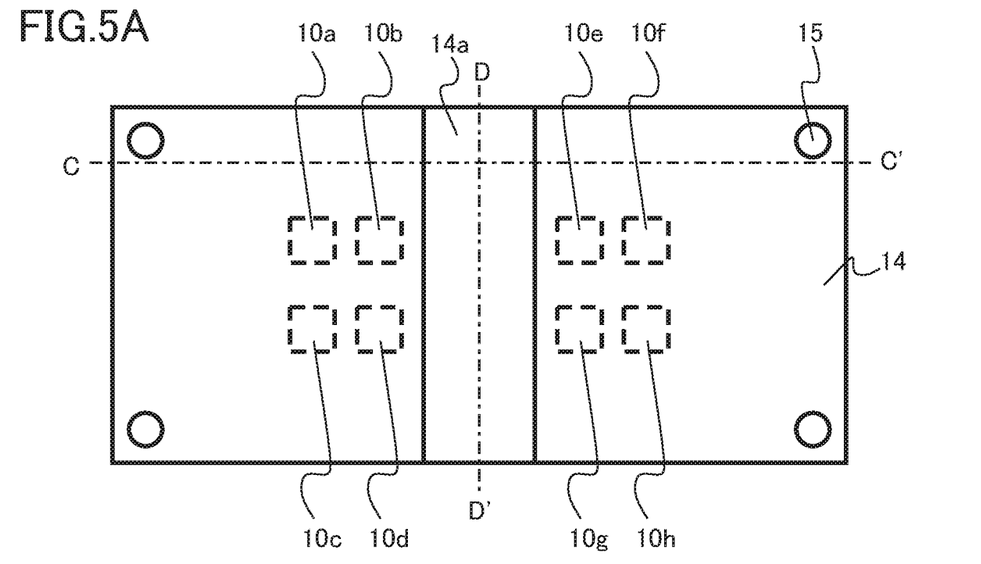
FIGS. 5A, 5B, and 5C are schematic views of a metal plate of a second embodiment.
Figure 5B:
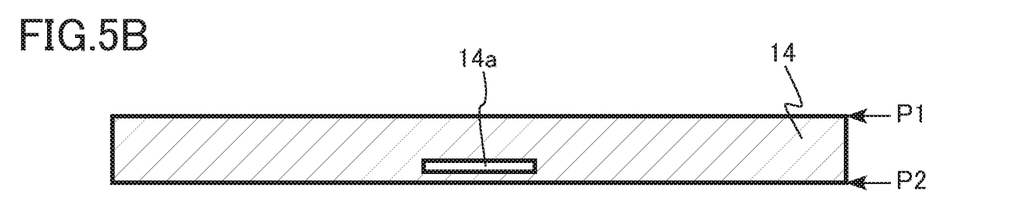
Figure 5C:
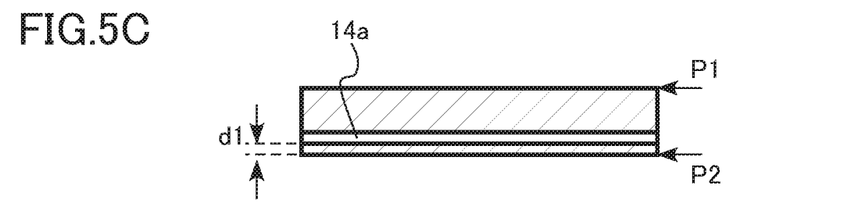

FIGS. 5A, 5B, and 5C are schematic views of a metal plate of the second embodiment. FIG. 5A is a top view of the metal plate. FIG. 5B is a cross-sectional view of the metal plate. FIG. 5B is a cross-sectional view taken along line C-C' of FIG. 5A. FIG. 5C is a cross-sectional view of the metal plate. FIG. 5C is a cross-sectional view taken along line D-D' of FIG. 5A.

The metal base plate 14 of the second embodiment includes a first ceramic plate 14a. The first ceramic plate 14a is provided directly below the region between the first to fourth MOSFETs 10a to 10d and the fifth to eighth MOSFETs 10e to 10h.

Figure 6A:
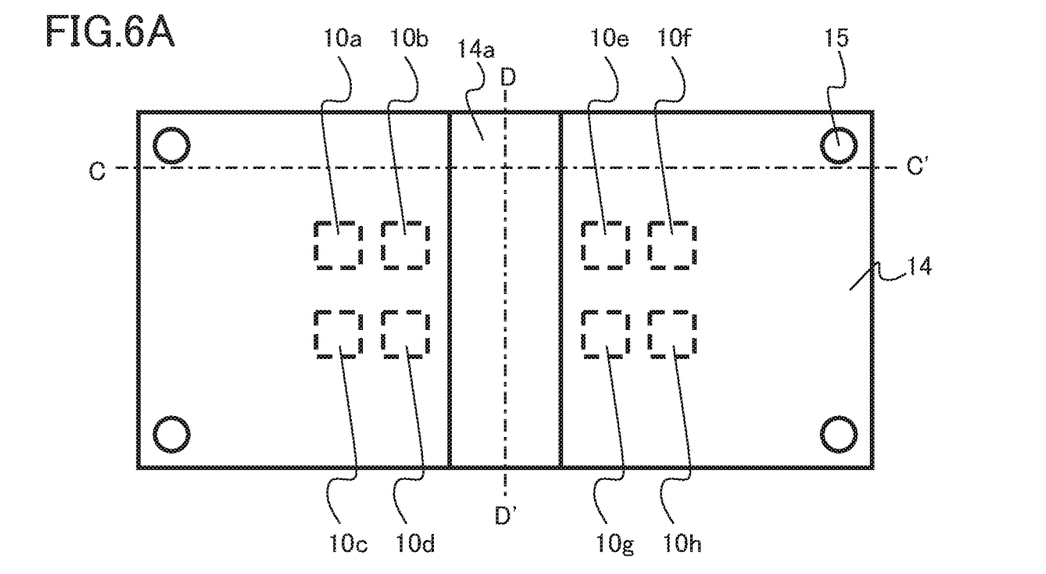
FIGS. 6A, 6B, and 6C are schematic views of a metal plate of Modified Example of the second embodiment.
Figure 6B:
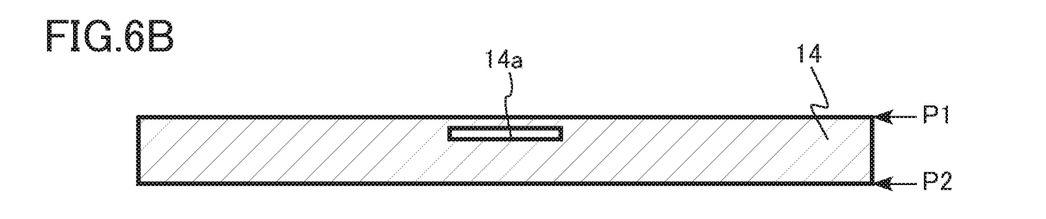
Figure 6C:
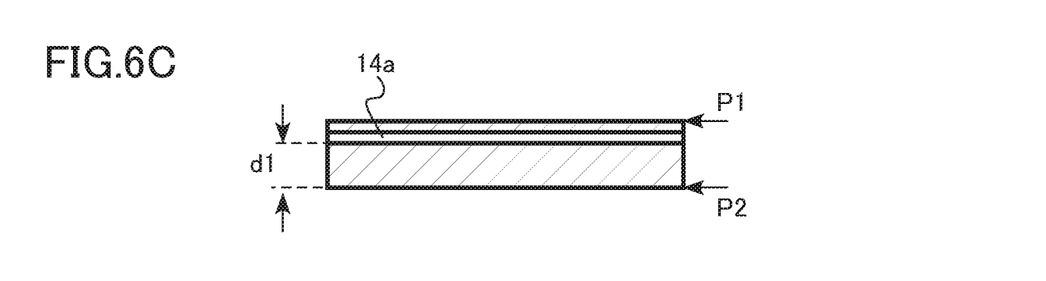

FIGS. 6A, 6B, and 6C are schematic views of a metal plate of Modified Example of the second embodiment. FIG. 6A is a top view of the metal plate. FIG. 6B is a cross-sectional view of the metal plate. FIG. 6B is a cross-sectional view taken along line C-C' of FIG. 6A. FIG. 6C is a cross-sectional view of the metal plate. FIG. 6C is a cross-sectional view taken along line D-D' of FIG. 6A.

In the metal base plate 14 of Modified Example of the second embodiment, the first distance (d1 in FIG. 6C) between the second plane P2 and the first ceramic plate 14a is different from the first distance (d1 in FIG. 5C) between the second plane P2 and the first ceramic plate 14a of the metal base plate 14 of the second embodiment.

As described above, according to the second embodiment and the modified example, similarly to the first embodiment, it is possible to implement a semiconductor device which can improve a heat dissipation property.

Third Embodiment

A semiconductor device of a third embodiment is different from the semiconductor device of the first embodiment in that the metal plate further includes a third ceramic plate, a fourth ceramic plate, and a fifth ceramic plate. Hereinafter, a portion of the contents overlapped with the first embodiment will be omitted in description.

Figure 7A:
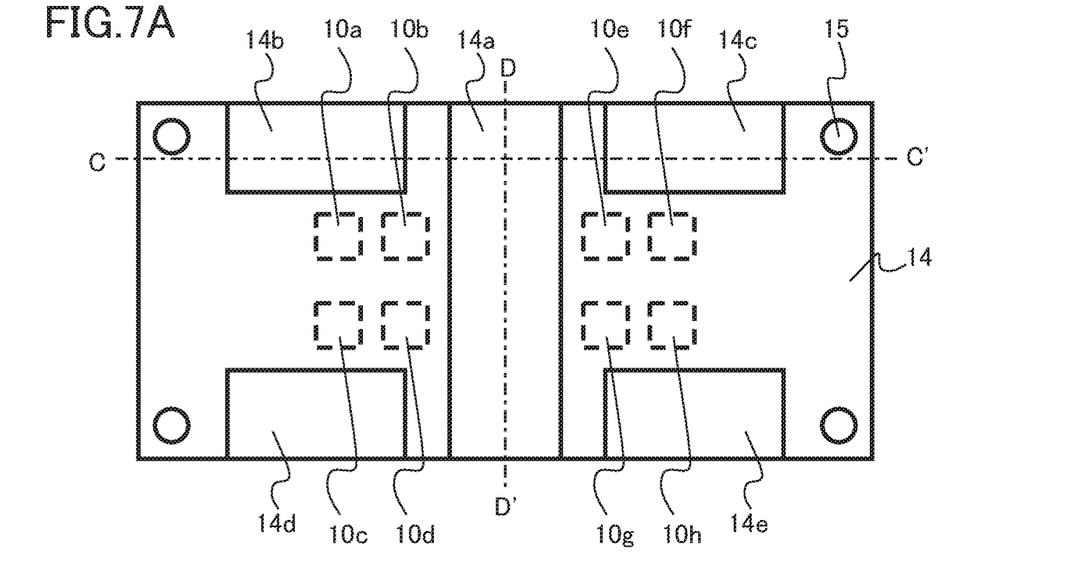
FIGS. 7A, 7B, and 7C are schematic views of a metal plate of a third embodiment.
Figure 7B:
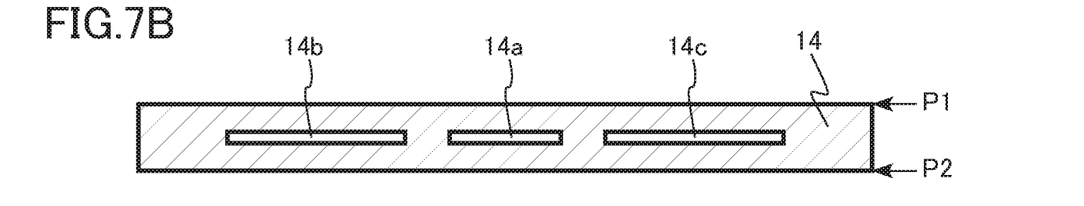
Figure 7C:
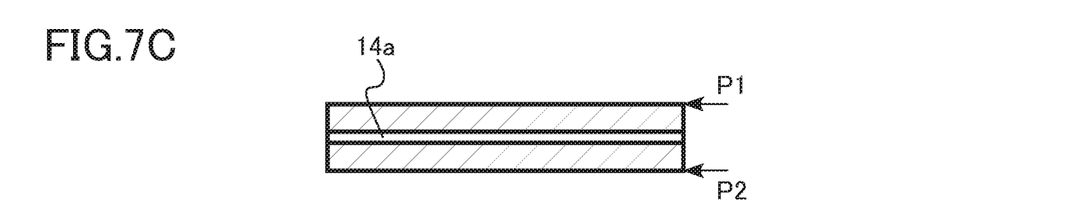

FIGS. 7A, 7B, and 7C are schematic views of a metal plate of the third embodiment. FIG. 7A is a top view of the metal plate. FIG. 7B is a cross-sectional view of the metal plate. FIG. 7B is a cross-sectional view taken along line C-C' of FIG. 7A. FIG. 7C is a cross-sectional view of the metal plate. FIG. 7C is a cross-sectional view taken along line D-D' of FIG. 7A.

The metal base plate 14 of the third embodiment includes a first ceramic plate 14a, a second ceramic plate 14b, a third ceramic plate 14c, a fourth ceramic plate 14d, and a fifth ceramic plate 14e. The first ceramic plate 14a, the second ceramic plate 14b, the third ceramic plate 14c, the fourth ceramic plate 14d, and the fifth ceramic plate 14e are located in the same plane parallel to the first plane P1 and the second plane P2 inside the metal base plate 14.

As described above, according to the third embodiment, similarly to the first embodiment, it is possible to implement a semiconductor device which can improve a heat dissipation property.

Fourth Embodiment

A semiconductor device of a fourth embodiment is different from the semiconductor device of the third embodiment in that a first distance between the second plane and the first ceramic plate is different from a second distance between the second plane and the second ceramic plate. Hereinafter, a portion of the contents overlapped with the first embodiment or the third embodiment will be omitted in description.

Figure 8A:
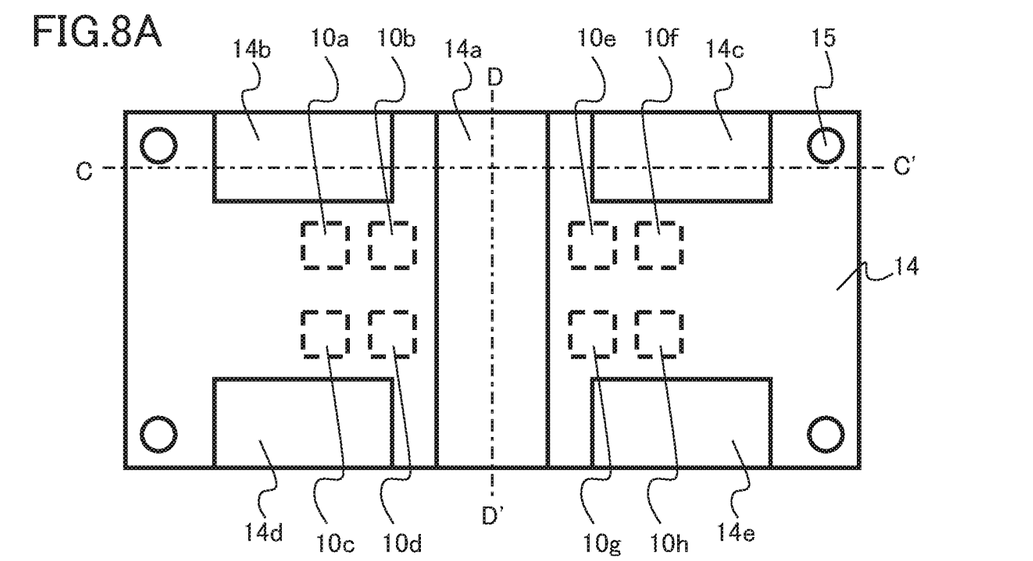
FIGS. 8A, 8B, and 8C are schematic views of a metal plate of a fourth embodiment.
Figure 8B:
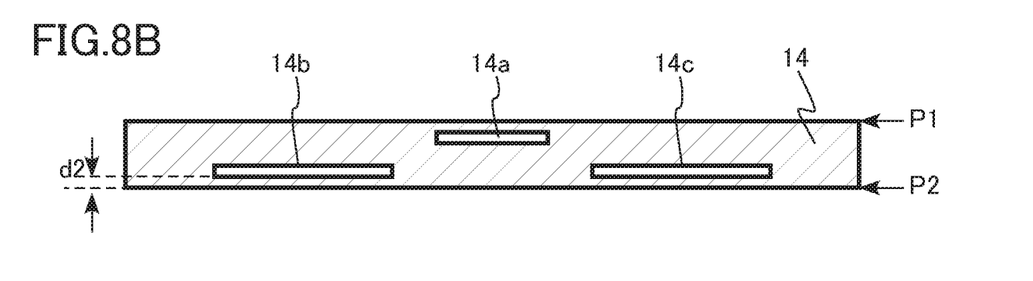
Figure 8C:
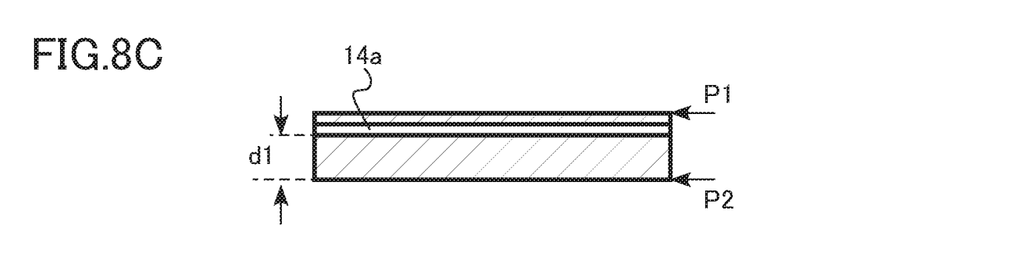

FIGS. 8A, 8B, and 8C are schematic views of a metal plate of the fourth embodiment. FIG. 8A is a top view of the metal plate. FIG. 8B is a cross-sectional view of the metal plate. FIG. 8B is a cross-sectional view taken along line C-C' of FIG. 8A. FIG. 8C is a cross-sectional view of the metal plate. FIG. 8C is a cross-sectional view taken along line D-D' of FIG. 8A.

The metal base plate 14 of the fourth embodiment includes a first ceramic plate 14a, a second ceramic plate 14b, a third ceramic plate 14c, a fourth ceramic plate 14d, and a fifth ceramic plate 14e. The first distance (d1 in FIG. 8C) between the second plane P2 and the first ceramic plate 14a is different from the second distance (d2 in FIG. 8B) between the second plane P2 and second ceramic plate 14b, the second distance d2 between the second plane P2 and the third ceramic plate 14c, the second distance d2 between the second plane P2 and fourth ceramic plate 14d, and the second distance d2 between the second plane P2 and the fifth ceramic plate 14e.

As described above, according to the fourth embodiment, similarly to the first embodiment, it is possible to implement a semiconductor device which can improve a heat dissipation property.

Fifth Embodiment

A semiconductor device of a fifth embodiment is different from the semiconductor device of the first embodiment in that the first ceramic plate and the second ceramic plate are at least partially overlapped in the direction normal to the first plane. Hereinafter, a portion of the contents overlapped with the first embodiment will be omitted in description.

Figure 9A:
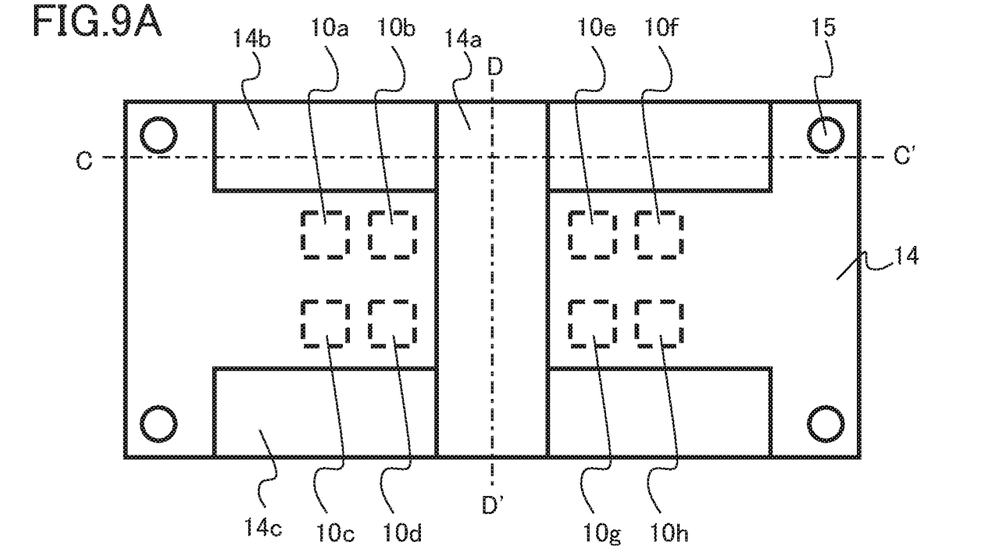
FIGS. 9A, 9B, and 9C are schematic views of a metal plate of a fifth embodiment.
Figure 9B:
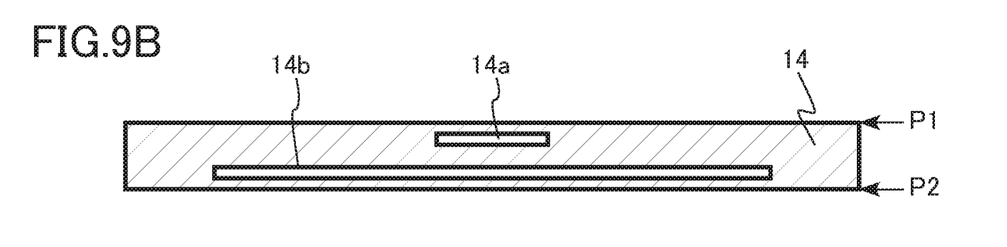
Figure 9C:
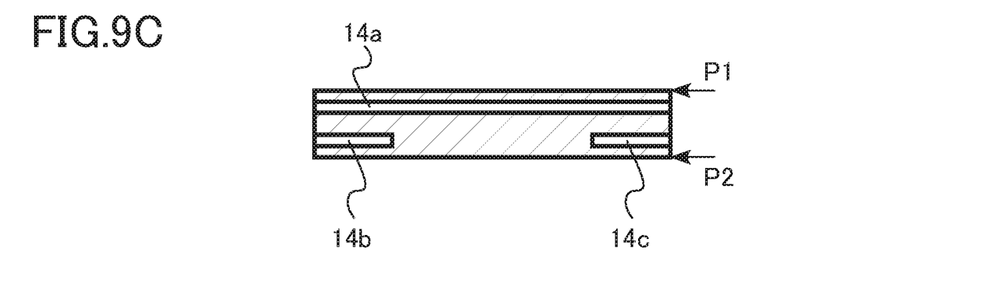

FIGS. 9A, 9B, and 9C are schematic views of a metal plate of the fifth embodiment. FIG. 9A is a top view of the metal plate. FIG. 9B is a cross-sectional view of the metal plate. FIG. 9B is a cross-sectional view taken along line C-C' of FIG. 9A. FIG. 9C is a cross-sectional view of the metal plate. FIG. 9C is a cross-sectional view taken along line D-D' of FIG. 9A.

The metal base plate 14 of the fifth embodiment includes a first ceramic plate 14a, a second ceramic plate 14b, and a third ceramic plate 14c. The first ceramic plate 14a and the second ceramic plate 14b are partially overlapped in the direction normal to the first plane P1. The first ceramic plate 14a and the third ceramic plate 14c are partially overlapped in the direction normal to the first plane P1.

As described above, according to the fifth embodiment, similarly to the first embodiment, it is possible to implement a semiconductor device which can improve a heat dissipation property.

Sixth Embodiment

A semiconductor device of a sixth embodiment is different from the semiconductor device of the first embodiment in that the metal plate includes a third ceramic plate, a fourth ceramic plate, and a fifth ceramic plate extending in parallel to the first ceramic plate and the second ceramic plate. Hereinafter, a portion of the contents overlapped with the first embodiment will be omitted in description.

Figure 10A:
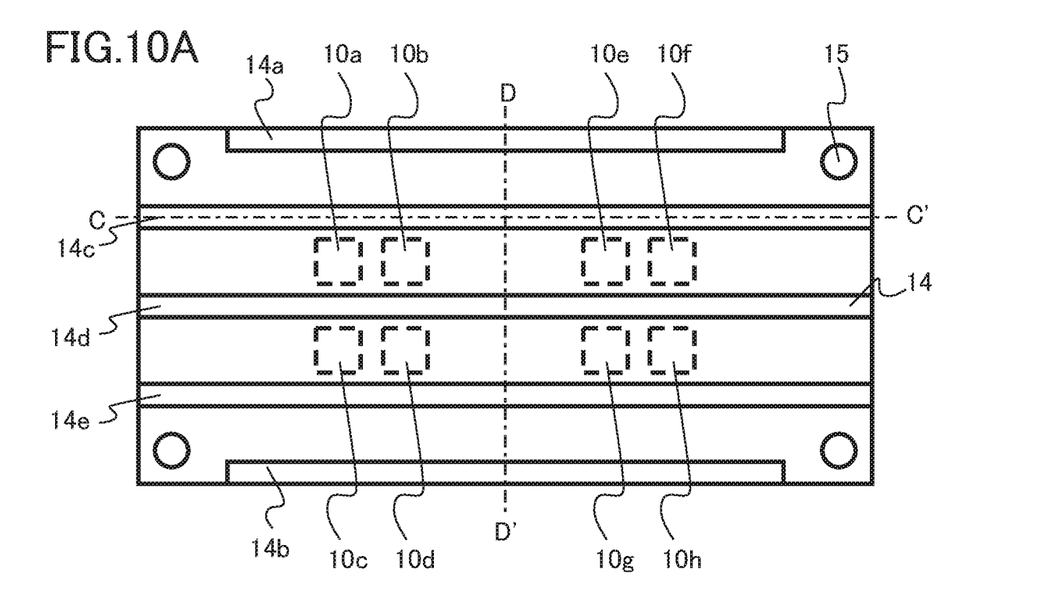
FIGS. 10A, 10B, and 10C are schematic views of a metal plate of a sixth embodiment.
Figure 10B:
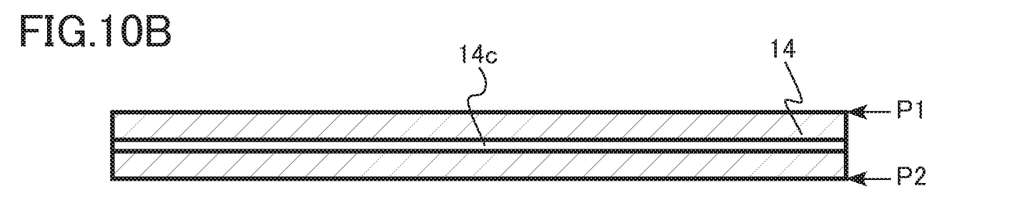
Figure 10C:
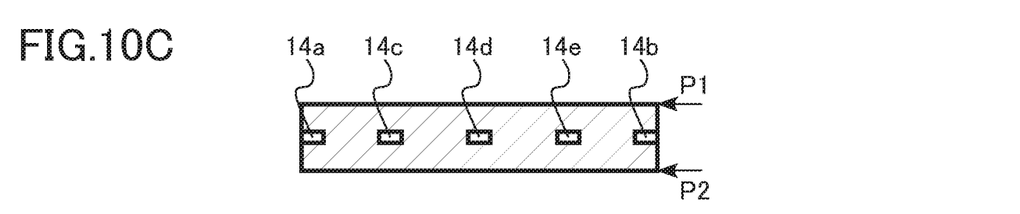

FIGS. 10A, 10B, and 10C are schematic views of a metal plate of a sixth embodiment. FIG. 10A is a top view of the metal plate. FIG. 10B is a cross-sectional view of the metal plate. FIG. 10B is a cross-sectional view taken along line C-C' of FIG. 10A. FIG. 10C is a cross-sectional view of the metal plate. FIG. 10C is a cross-sectional view taken along line D-D' of FIG. 10A.

The metal base plate 14 of the sixth embodiment includes a first ceramic plate 14a, a second ceramic plate 14b, a third ceramic plate 14c, a fourth ceramic plate 14d, and a fifth ceramic plate 14e. The first ceramic plate 14a, the second ceramic plate 14b, the third ceramic plate 14c, the fourth ceramic plate 14d, and the fifth ceramic plate 14e extend in parallel to each other. The first ceramic plate 14a, the second ceramic plate 14b, the third ceramic plate 14c, the fourth ceramic plate 14d, and the fifth ceramic plate 14e are located in the same plane parallel to the first plane P1 and the second plane P2 inside the metal base plate 14.

As described above, according to the sixth embodiment, similarly to the first embodiment, it is possible to implement a semiconductor device which can improve a heat dissipation property.

Seventh Embodiment

A semiconductor device of a seventh embodiment is different from the semiconductor device of the second embodiment in that the first ceramic plate is located between the second semiconductor chip and the second plane, and the first ceramic plate is located between the third semiconductor chip and the second plane. Hereinafter, a portion of the contents overlapped with the first embodiment or the second embodiment will be omitted in description.

Figure 11A:
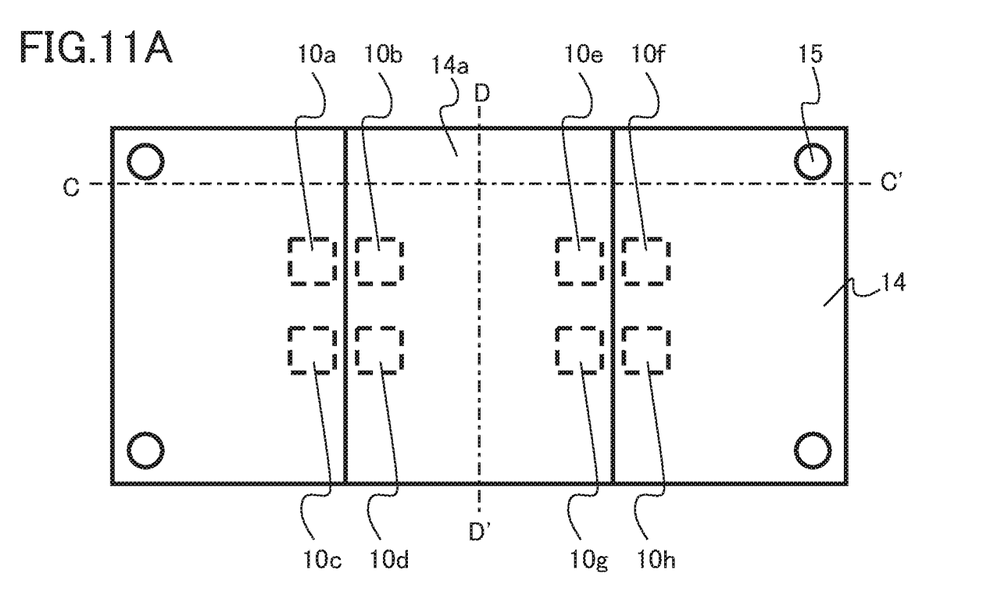
FIGS. 11A, 11B, and 11C are schematic views of a metal plate of a seventh embodiment.
Figure 11B:
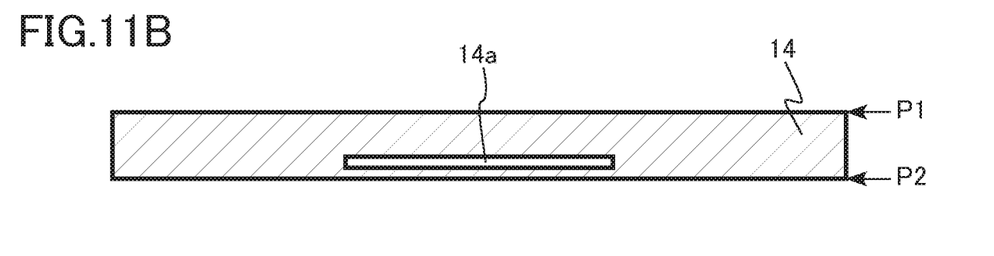
Figure 11C:
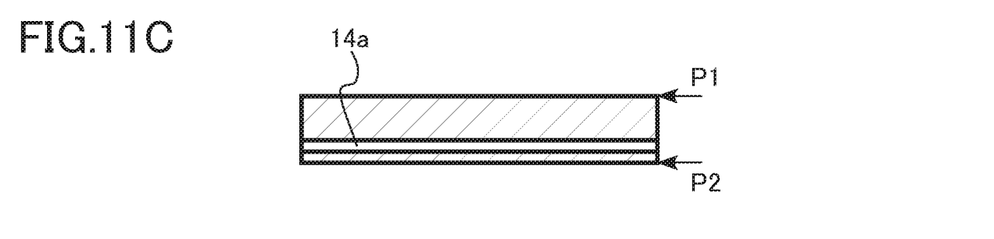

FIGS. 11A, 11B, and 11C are schematic views of a metal plate of the seventh embodiment. FIG. 11A is a top view of the metal plate. FIG. 11B is a cross-sectional view of the metal plate. FIG. 11B is a cross-sectional view taken along line C-C' of FIG. 11A. FIG. 11C is a cross-sectional view of the metal plate. FIG. 11C is a cross-sectional view taken along line D-D' of FIG. 11A.

In the metal base plate 14 of the seventh embodiment, the first ceramic plate 14a is not located between the first MOSFET 10a (first semiconductor chip) and the second plane P2 and between the third MOSFET 10c and the second plane P2. In addition, the first ceramic plate 14a is not located between the sixth MOSFET 10f and the second plane P2 and between the eighth MOSFET 10h and the second plane P2.

In the metal base plate 14 of the seventh embodiment, the first ceramic plate 14a is not located in the direction normal to the first plane P1 of the first MOSFET 10a (first semiconductor chip) and the third MOSFET 10c. In addition, the first ceramic plate 14a is not located in the direction normal to the first plane P1 of the sixth MOSFET 10f and the eighth MOSFET 10h.

On the other hand, in the metal base plate 14 of the seventh embodiment, the first ceramic plate 14a is located between the second MOSFET 10b (second semiconductor chip) and the second plane P2 and between the fourth MOSFET 10d and the second plane P2. In addition, the first ceramic plate 14a is located between the fifth MOSFET 10e (third semiconductor chip) and the second plane P2 and between the seventh MOSFET 10g and the second plane P2.

In the metal base plate 14 of the seventh embodiment, the first ceramic plate 14a is located in the direction normal to the first plane P1 of the second MOSFET 10b (second semiconductor chip) and the fourth MOSFET 10d. In addition, the first ceramic plate 14a is located in the direction normal to the first plane P1 of the fifth MOSFET 10e (third semiconductor chip) and the seventh MOSFET 10g.

As described above, according to the seventh embodiment, similarly to the first embodiment, it is possible to implement a semiconductor device which can improve a heat dissipation property.

In the first to seventh embodiments, the MOSFETs have been described as examples of the semiconductor chips, but the semiconductor chips may be IGBTs or diodes. In addition, for example, a MOSFET and a diode or a combination of the IGBT and the diode may be used.

In addition, the number of semiconductor chips to be mounted on one insulating circuit board is not limited to four, but the number may be three or less or may be five or more. In addition, the number of insulating circuit boards of the power semiconductor module 100 may be one or may be three or more.

In the first to seventh embodiments, a case in which the silicone gel 34 is used as the sealing material has been described as an example, but instead of the silicone gel 34, it is also possible to use, for example, other resin materials such as an epoxy resin.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor chip;
a metal plate having a first plane and a second plane facing the first plane, the metal plate including a first ceramic plate provided between the first plane and the second plane, and the metal plate including a second ceramic plate provided between the first plane and the second plane; and
a first insulating board provided between the metal plate and the first semiconductor chip, the first insulating board facing the first plane,
wherein the first ceramic plate does not exist between the first semiconductor chip and the second plane.

2. The semiconductor device according to claim 1, wherein a first distance between the second plane and the first ceramic plate and a second distance between the second plane and the second ceramic plate are substantially equal to each other.

3. The semiconductor device according to claim 1, wherein a first distance between the second plane and the first ceramic plate and a second distance between the second plane and the second ceramic plate are different from each other.

4. The semiconductor device according to claim 3, wherein the first ceramic plate and the second ceramic plate are at least partially overlapped with each other in a direction normal to the first plane.

5. The semiconductor device according to claim 1, further comprising a second semiconductor chip, the first insulating board being located between the second semiconductor chip and the metal plate,
wherein the first ceramic plate does not exist between the second semiconductor chip and the second plane.

6. The semiconductor device according to claim 1, further comprising:
a third semiconductor chip; and
a second insulating board being provided between the third semiconductor chip and the metal plate, the second insulating board facing the first plane,
wherein the first ceramic plate does not exist between the third semiconductor chip and the second plane.

7. The semiconductor device according to claim 1, wherein the first insulating board includes a ceramic layer, and
wherein the first ceramic plate and the ceramic layer are made of the same material.

8. The semiconductor device according to claim 1, wherein the metal plate is made of aluminum.

9. The semiconductor device according to claim 1, wherein the first ceramic plate is made of aluminum nitride, silicon nitride, or aluminum oxide.

10. The semiconductor device according to claim 1, wherein the metal plate is made of aluminum.

11. The semiconductor device according to claim 1, wherein the first ceramic plate is made of aluminum nitride, silicon nitride, or aluminum oxide.

12. A semiconductor device comprising:
a first semiconductor chip;
a second semiconductor chip;
a metal plate having a first plane and a second plane facing the first plane, the metal plate including a first ceramic plate provided between the first plane and the second plane; and
a first insulating board provided between the metal plate and the first semiconductor chip, the first insulating board facing the first plane; and
a second insulating board provided between the metal plate and the second semiconductor chip, the second insulating board facing the first plane,
wherein the first ceramic plate does not exist between the first semiconductor chip and the second plane, and
wherein the first ceramic plate does not exist between the second semiconductor chip and the second plane.

13. The semiconductor device according to claim 12, wherein the metal plate includes a second ceramic plate provided between the first plane and the second plane.

14. The semiconductor device according to claim 13, wherein a first distance between the second plane and the first ceramic plate and a second distance between the second plane and the second ceramic plate are substantially equal to each other.

15. The semiconductor device according to claim 13, wherein a first distance between the second plane and the first ceramic plate and a second distance between the second plane and the second ceramic plate are different from each other.

16. The semiconductor device according to claim 15, wherein the first ceramic plate and the second ceramic plate are at least partially overlapped with each other in a direction normal to the first plane.

17. The semiconductor device according to claim 12, further comprising a third semiconductor chip, the first insulating board being located between the third semiconductor chip and the metal plate,
wherein the first ceramic plate does not exist between the third semiconductor chip and the second plane.

18. The semiconductor device according to claim 12, wherein the first insulating board includes a ceramic layer, and
wherein the first ceramic plate and the ceramic layer are made of the same material.

* * * * *